United States Patent
Mehringer et al.

(10) Patent No.: US 6,720,758 B2
(45) Date of Patent: Apr. 13, 2004

(54) METHOD AND APPARATUS FOR MONITORING AN ELECTRICAL CURRENT CONSUMING DEVICE

(75) Inventors: Paul Mehringer, Stuttgart (DE); Christopher Huber, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/270,979

(22) Filed: Oct. 15, 2002

(65) Prior Publication Data

US 2003/0071610 A1 Apr. 17, 2003

(30) Foreign Application Priority Data

Oct. 16, 2001 (DE) .......................................... 101 51 065

(51) Int. Cl.[7] .............................................. G01R 11/32
(52) U.S. Cl. .................... 324/142; 324/103 P; 340/664
(58) Field of Search ......................... 324/95, 142, 127, 324/126, 103 P, 102, 94; 340/664, 657, 661, 662, 663; 361/93, 88

(56) References Cited

U.S. PATENT DOCUMENTS 4,983,955 A * 1/1991 Ham et al. ................... 340/664
5,471,134 A * 11/1995 Oudille et al. ........... 324/103 P

* cited by examiner

*Primary Examiner*—Kamand Cuneo
*Assistant Examiner*—Jimmy Nguyen
(74) *Attorney, Agent, or Firm*—Michael J. Striker

(57) ABSTRACT

A method and an apparatus for monitoring an electrical power or current consuming device. In the method for monitoring a first time point at which a current value for current passing through the consuming device exceeds a first current threshold value and/or a second time point at which the current value drops below a second current threshold value is first measured. Then first time point and/or the second time point are compared with each other or with other variables, especially a starting time for a control signal for controlling the consuming device, to establish plausibility.

8 Claims, 5 Drawing Sheets

METHOD AND APPARATUS FOR MONITORING AN ELECTRICAL CURRENT CONSUMING DEVICE

BACKGROUND OF THE INVENTION

The present invention relates to methods and apparatus for monitoring an electrical power or current consuming device, or consumer.

Methods and apparatus for monitoring electrical power or current consuming devices, or consumers, which are used in motor vehicles and especially in fuel supply systems, are known.

SUMMARY OF THE INVENTION

It is an object of the present invention to provide an improved method for monitoring an electrical power or current consuming device or consumer, especially in a motor vehicle and particularly its fuel supply system.

It is another object of the present invention to provide an improved apparatus or system for monitoring an electrical power or current consuming device or consumer, especially in a motor vehicle and particularly its fuel supply system.

In the method according to the invention a first time point at which a current value for current passing through the consuming device exceeds a first current threshold value and/or a second time point at which the current value drops below a second current threshold value is measured. Then the measured first time point and/or the second time point are compared with each other and/or with other variables to establish plausiblity.

Reliable monitoring of the electrical power or current consuming device results because of the above-described features of the method according to the invention. The method according to the invention reliably monitors the beginning of control, the controlling of the current flow and/or the current, e.g. that flows through a fuel injector device for an internal combustion engine. The method essentially tests whether or not the current flowing through the consuming device is plausible in comparison with the control signal and/or with variables correlated with it.

Preferably the first and the second threshold values take different values. In a simplified embodiment both current threshold values take the same value. The first time point is the time point at which the current that flows through the consuming device exceeds a certain first current value. The second time point is the time point at which the current that flows through the consuming device drops below a second current value.

It is particularly advantageous when the other variables, which are compared with the first and/or second time points, include a control signal that characterizes the start and/or the end of the control process. Preferably the control signal controls a switch means which controls the current flow through the consuming device. Instead of these variables other signals, which depend on the control signal and/or on that which is controlled by the control signal, can be used. For example, the fuel feed signal can be used during the control, which characterizes the start of the fuel injection and/or the end of the fuel injection and/or the fuel injection duration.

In an especially preferred embodiment implausibility is detected when the interval between the first and the second time point is less than a first threshold value and/or greater than a second threshold value. This means that the duration of the time interval during which the current exceeds the threshold value takes an implausible value. Preferably whether or not this time interval is too long and/or too short is tested. First comparison can take place with first values and also with the maximum value and the minimum value for this time interval depending on the size of a variable, which depends on the start of control and the end of the control.

In another embodiment implausibility is detected when the time interval between the first time point and the control signal, which characterizes the beginning of control, is greater than a threshold value. This means that an error is detected when the control signal, which characterizes the end of control is not correlated with an increase of the current beyond the threshold value.

In an additional embodiment implausibility is detected when the time interval between the second time point and the control signal, which characterizes the end of the control signal, is greater than a threshold value. This means that an error is detected when the control signal, which characterizes the end of control is not correlated with a decrease of the current below the threshold value.

BRIEF DESCRIPTION OF THE SEVERAL VIEWS OF THE DRAWING

The objects, features and advantages of the invention will now be illustrated in more detail with the aid of the following description of the preferred embodiments, with reference to the accompanying figures in which.

DETAILED DESCRIPTION OF THE INVENTION

A procedure for monitoring according to the invention is described in the following using the example of an electromagnetic consumer, which controls fuel supply to an internal combustion engine. This procedure according to the invention is however not limited to this application. It can also be used with other consumers, which are controlled one after the other. These consumers especially include the magnetic valves that control the flow of liquids in the motor vehicle.

Figure 1:
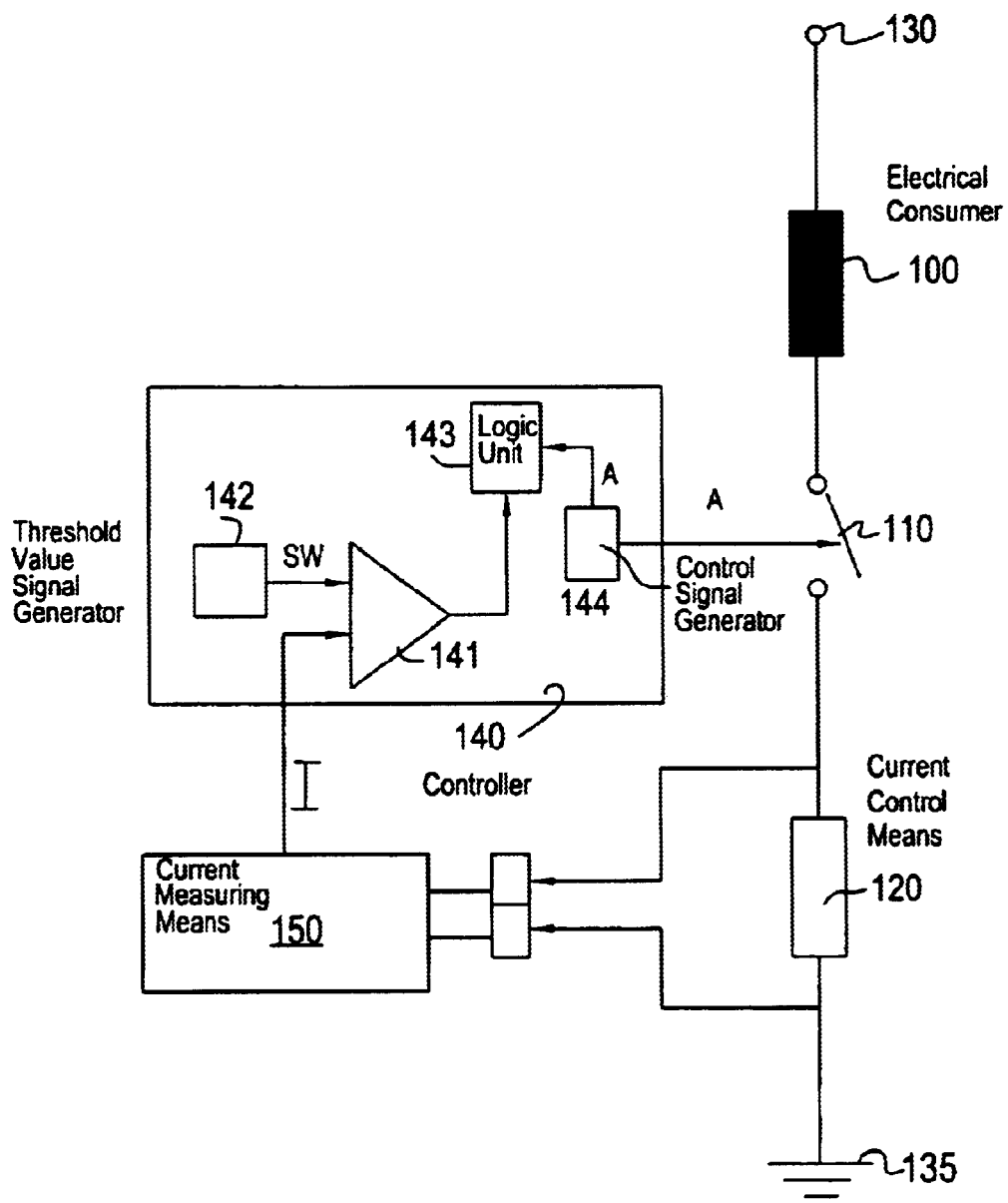
FIG. 1 is a block diagram of an apparatus for monitoring an electrical power or current consuming device according to the invention showing the essential components of the apparatus.

Usually the electrical consumer 100, switch means 110 and a current control means 120 are connected in series with each other between a voltage supply 130 and ground. This series arrangement of these components is shown in FIG. 1 for example.

A controller 140 acts on or supplies the switch means 110 with a control signal A. The current control means 120, which is embodied, for example, as a resistance in FIG. 1, is connected with a current measuring means 150. The current measuring means 150 supplies a current signal I to the controller 140, which depends on the current flowing through the current control means 120.

The controller 140 comprises, among other components, a comparing device 141. The input signal I depending on the current through the supply means and an output signal SW from a threshold value signal generator 142 are both fed to the comparing device 141 for comparison with each other. A logic unit 143 processes the output signal from the comparing device 141. The control signal A is also supplied to this logic unit 143. A control signal generator 144 produces the control signal A.

Based on the various operating parameters of the internal combustion engine and/or the accompanying conditions, for example driver choices, the signal generator 144 produces the appropriate control signal A for controlling the switch means 110. The switch means 110 releases the current flow through the electro-magnetic consumer 100 depending on the control signal A. Fuel to the internal combustion engine is supplied or blocked by the electromagnetic consumer 100, according to the control signal A. The amount of fuel injected depends on the control signal A.

Usually the current flowing through the consumer 100 is controlled by means of the current control means 120. In the embodiment shown in the drawing the current control means 120 is a resistor. The current measuring means 150 processes the voltage drop across the resistor 120 and produces the current signal 1, which is a measure of the current flowing through the resistor 120, according to the voltage drop. This current signal I is processed or evaluated by the controller 140.

In the procedure according to the invention the current, which flows through the consumer is measured and is compared with a threshold value characterized by the threshold value signal SW. The time point at which the current exceeds its threshold value and a second time point at which the current is below its threshold value are both measured. These time points are checked for plausibility with other variables or with each other.

This means that the current behavior is essentially digitized, i.e. a signal D is produced when the current I exceeds its first threshold value SW1 and the signal D is dropped when the current I falls below the second threshold value SW2. As long as the current is between the first and second threshold values, the digital signal D is present.

When the current is to be controlled to different current values, the threshold values are set at those values, which are under the lowest current value, at which the magnetic value is supplied with current and remains in its corresponding state. For example, it is provided that, when the current is controlled so that it is at a holding current value after a short turn-on stage, the threshold values are smaller than the holding current value.

In a first embodiment of the method according to the invention whether or not the current increase is within a predetermined time interval or window is tested. The time window is preferably defined by a first time value ST1 and a second time value ST2, within which the current value must exceed the threshold value.

In another embodiment whether or not the drop of current is within a predetermined time window is tested.

It is especially advantageous when these threshold values ST1 and ST2 depend on a control signal for the electrical power or current consuming device. When the threshold values ST1 and ST2 are given usually the current value is rising or falling exponentially when it reacts to the control signal and then after a certain delay time the current exceeds or drops below its threshold value.

Figure 2:
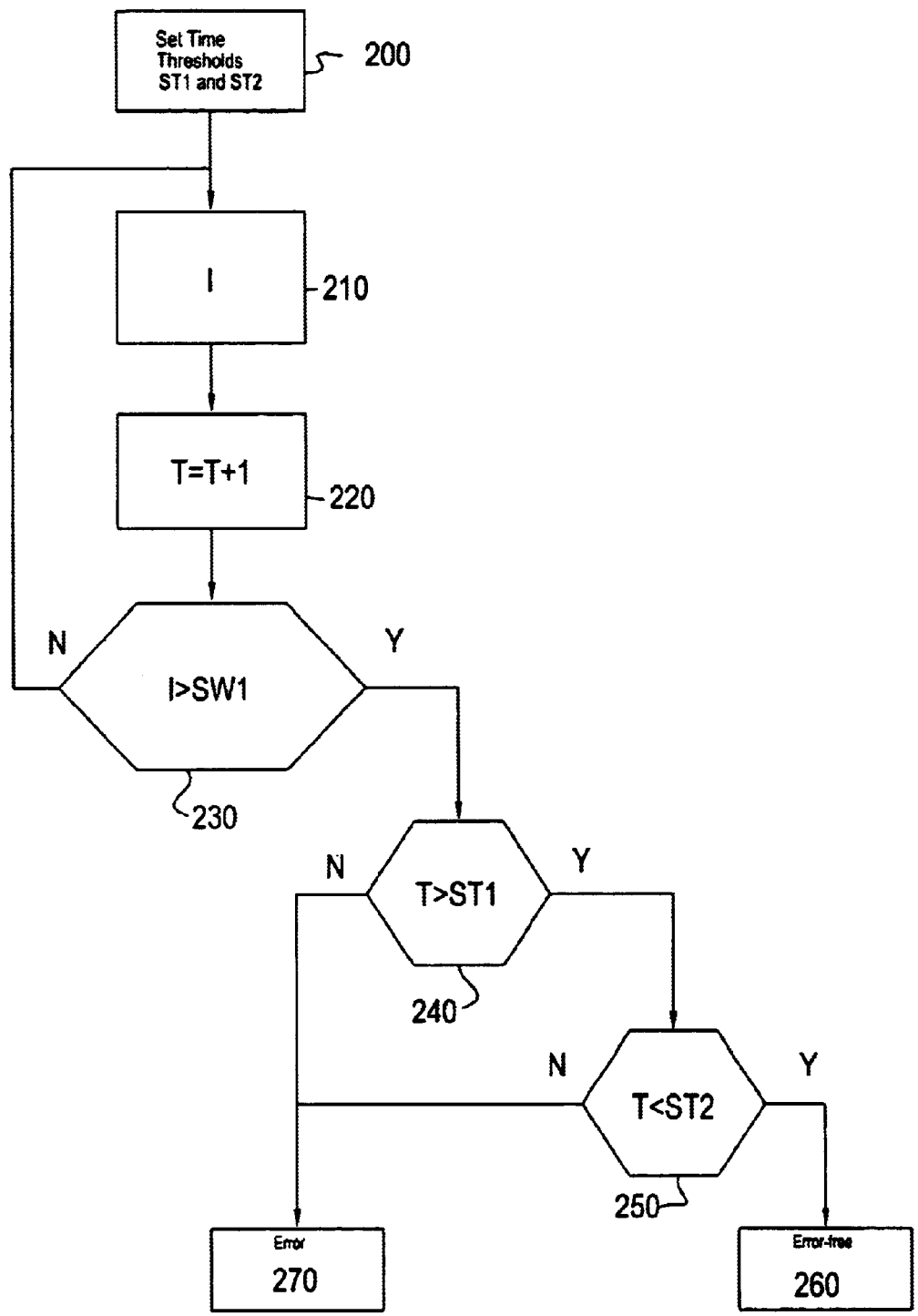
FIGS. 2 and 3 are flow charts for respective different embodiments of the method for monitoring an electrical power or current consuming device according to the invention.

A preferred embodiment of the method according to the invention is illustrated in FIG. 2. In this embodiment the monitoring preferably occurs in parallel with control. Alternatively it can also be provided that the monitoring can occur after ending control. For this purpose the control duration, the controlling, the time point at which the signal exceeds the first threshold and the time point at which the signal falls below the second threshold can be stored in a memory and compared with each other for plausibility after the controlling.

In a first step 200 the time threshold values ST1 and ST2, which define the time window, during which the current passing through the electrical power or current consuming device should exceed the current threshold value SW1, are given or established. This procedure occurs preferably based on the control signal A, which, for example, determines the control beginning and thus the beginning of the fuel feed.

In the second step 210 the measured current signal I for the current is produced. Subsequently in step 220 a time counter T increases by one. In the decision step 230 whether or not the current I is greater than a threshold value SW1 is determined. If this is not the case the method returns to step 210. If it is the case, the method proceeds to the decision step 240 in which whether or not the time counter T is greater than a first time threshold value ST1 is established. If it is the case the method proceeds to an additional decision step 250 in which whether or not the time counter T is less than a second time threshold value ST2 is determined. If this is the case, then error-free operation is detected in step 260.

If the decision step 240 determines that the time is not greater than the threshold value ST1, or if the decision step 250 detects that the time is not less than the threshold value ST2 (i.e. the time point at which the current exceeds the threshold value SW1 is outside a predetermined time window) then an error or erroneous operating condition is detected in step 270.

In the illustrated embodiment whether or not the beginning of the control signal and the beginning of the digital signal D are plausible are tested. That means that whether or not the time interval between the beginning of the control signal and the beginning of the digital signal is less than an allowed value is tested.

The method proceeds accordingly when the current signal falls below the threshold value SW2. This means that whether or not the end of the control signal and the end of the digital signal D are plausible is tested. This means that whether or not the interval between the end of the control signal and the end of the digital signal is less than an allowed value is tested.

Figure 3:
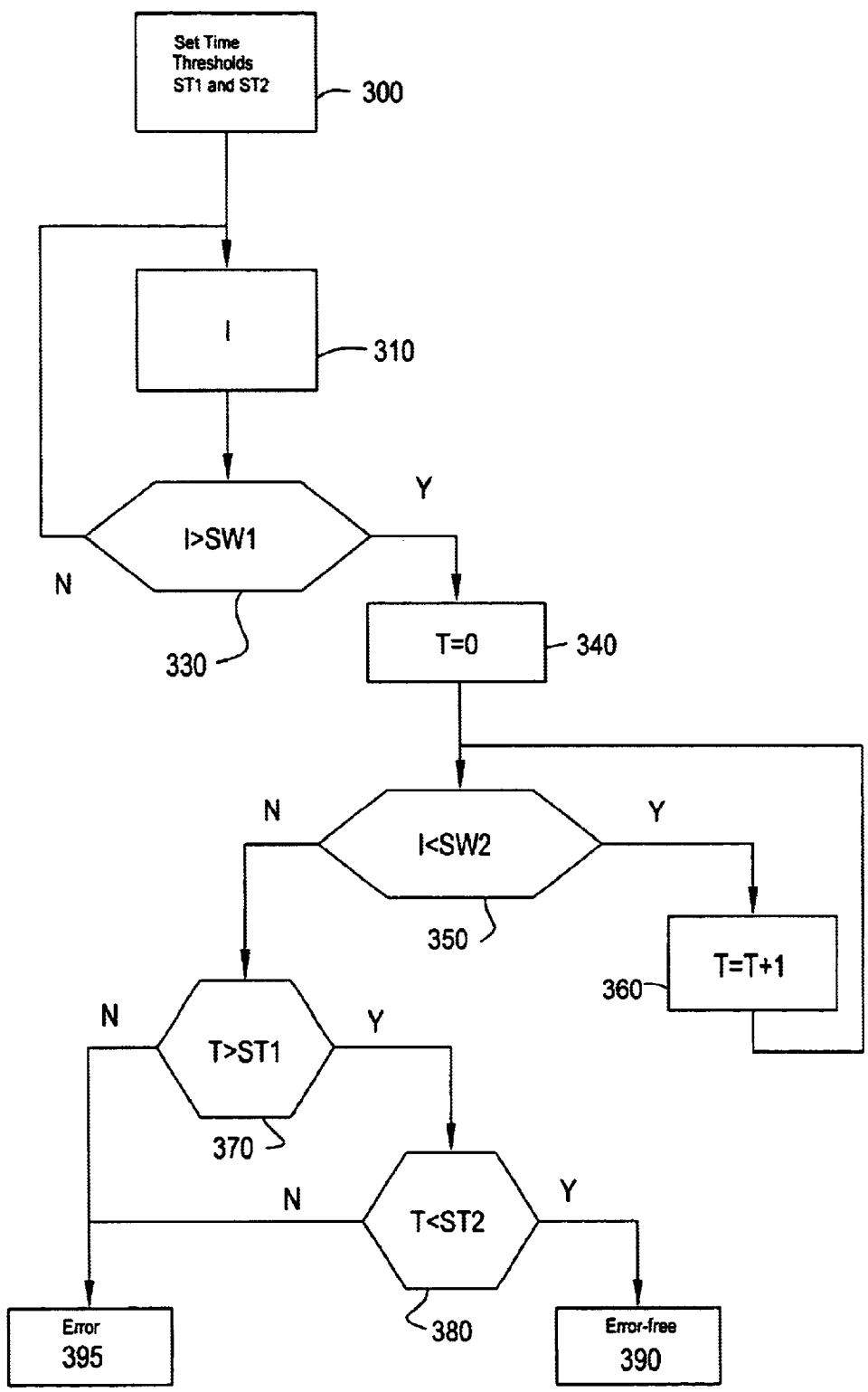

An additional preferred embodiment of the method according to the invention is illustrated in FIG. 3. In this method the time interval during which the threshold values are exceed is monitored.

In a first step 300 the threshold values ST1 and ST2, which define the time window, during which the current passing through the electrical power or current consuming device should exceeds the threshold value, are set up or established. This procedure preferably occurs based on the control signal A, which, for example, establishes the start and end of the control and the start and the end of the fuel feed. The measured value I for the current is determined in a second step 310.

If the decision step 330 detects that the current I is greater than the current threshold value SW1, a time counter T is set to zero in step 340. The subsequent decision step 350 tests whether or not the current I is less than the current threshold value SW2. If this is the case, the time counter is increased by one in step 360. If this is not the case, i.e. if the current exceeds the threshold value SW2, whether or not the time counter T is greater than a time threshold value ST1 is tested. If this is the case whether or not the time counter T is less than a second time threshold value ST2 is tested in step 380. If this is true, an error-free operating condition is signaled or detected in step 390. If this is not true or the case, i.e. if the time counter T is less than the first time threshold value ST1 or greater than the second time threshold value ST2 an error or erroneous operating condition is detected or signaled in step 395.

This means that the current in a predetermined time window, which is defined by the threshold values ST1 and ST2, is larger than the threshold value SW, so that error-free operation is detected. When the current is larger than its threshold value during a time interval that is larger or smaller than the time window, an erroneous operating condition is detected.

This means that the duration of the control signal is compared with the duration of the digital signal for plausibility. If the duration of both signals deviate substantially from each other, an error is also detected. If the digital signal is substantially longer or substantially shorter than the control signal, an error is detected.

Figure 4A:
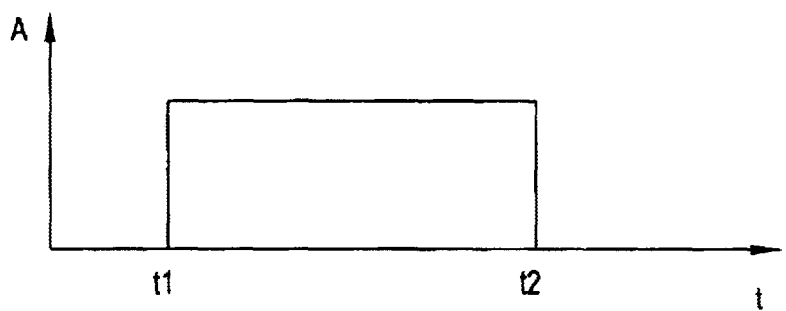
FIGS. 4a to 4i are graphical illustrations showing the behavior of various signals in the apparatus for monitoring according to the invention as a function of time.

In FIGS. 4a to 4i various signals are illustrated as a function of time. In FIG. 4a the control signal A for the switch means 110 is illustrated versus time. The control of the electrical power or current consuming device starts at time point t1 and ends at time point t2.

Figure 4B:
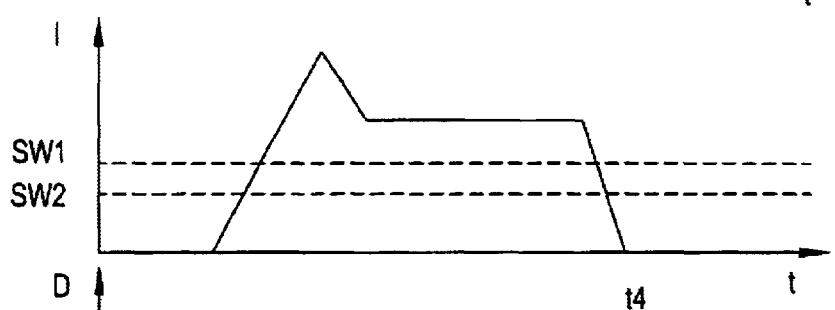

In FIG. 4b the behavior of the current is illustrated purely in a qualitative manner. Furthermore the current threshold SW is shown with the dashed lines. At the time point t1 the current increases to a first value. Subsequently the current drops to a holding level. After the end of the control at time point t2 the current again drops to the value zero. At the time point t5 the current exceeds the threshold value SW1 and at time point t6 the current drops to the threshold value SW2.

Figure 4C:
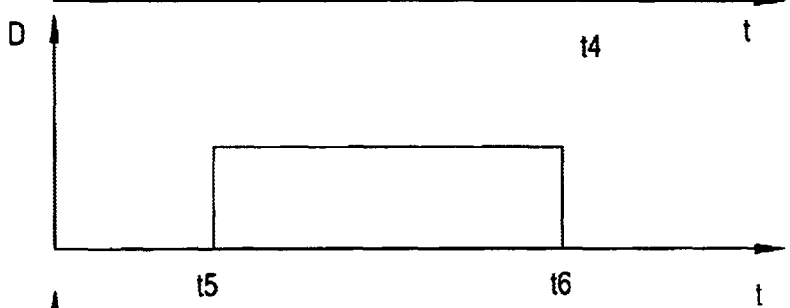
Figure 4D:
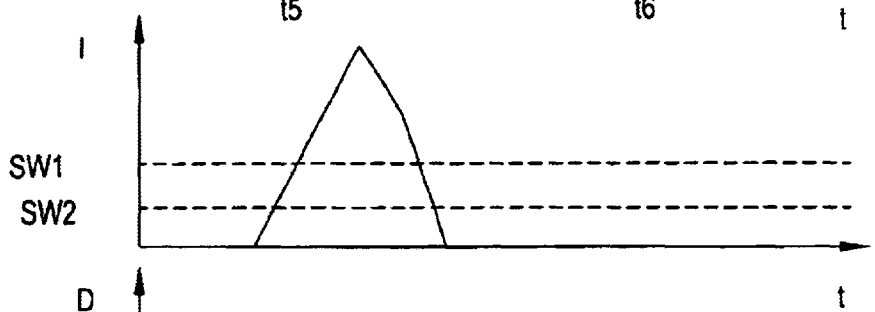
Figure 4E:
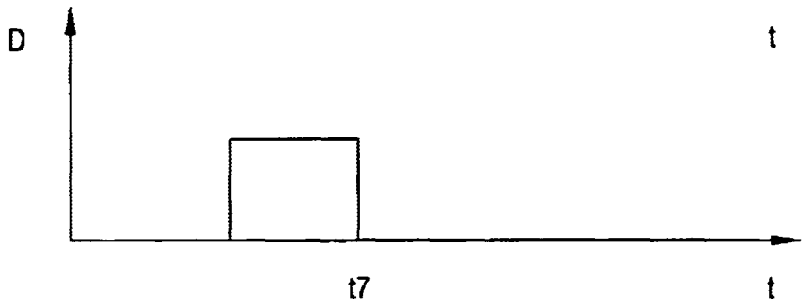

In FIG. 4c the signal is illustrated, which shows that the current is greater than the threshold value SW1. An error or erroneous operating condition is shown by the current behavior according to FIG. 4d. In FIG. 4e an erroneous condition is illustrated. Already at time point t7 the current drops below the current threshold value. That means that the current is larger than the current threshold value for too short a time interval or the interval between the time point t7 and the time point t2 is greater than expected.

Figure 4F:
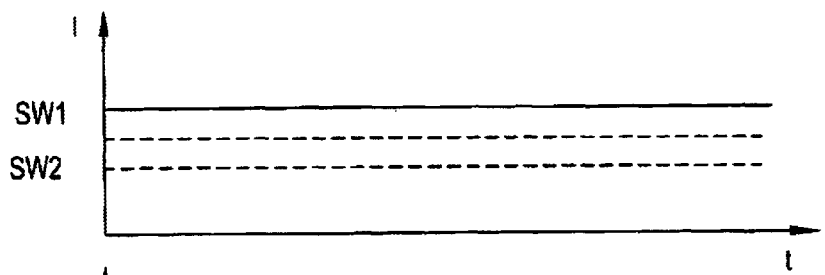
Figure 4G:
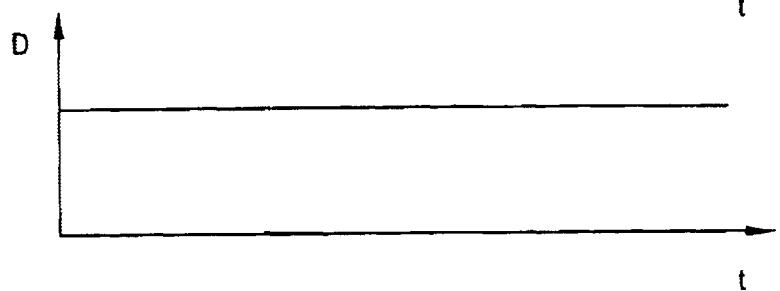

Additional erroneous current behavior I is illustrated in FIG. 4f and the associated digital signal is shown in FIG. 4g. This current signal occurs during flow of current through the consumer. This erroneous behavior is detected because first the duration of the signals are not plausible and also the beginning and end of the signals are not plausible.

An additional erroneous current behavior is not illustrated however. This occurs when the current flow is interrupted and the current does not flow through the consuming device at any time. This error is detected because the duration of the signals is not plausible and the start and finish of the signals are not plausible.

Figure 4H:
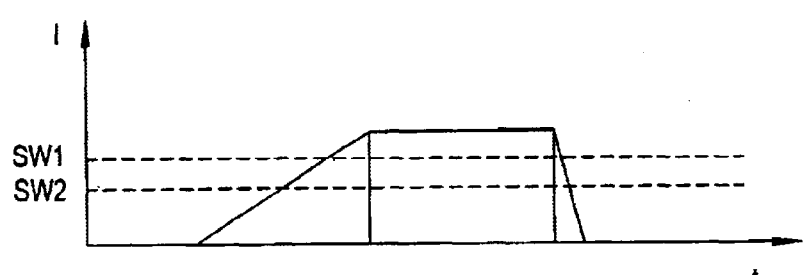
Figure 4I:
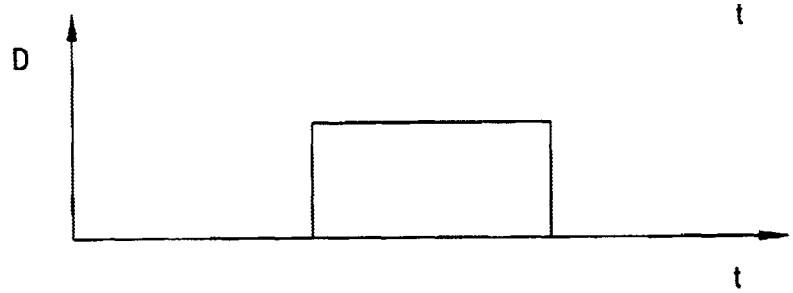

In FIG. 4h a current behavior is illustrated in which the current rise is lengthened. The corresponding digital signal is illustrated in FIG. 4i. This error is detected because first the duration of the signals is not plausible and second the start of the signals is not plausible.

The disclosure in German Patent Application 101 51 065.9 of Oct. 16, 2001 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method and apparatus for monitoring an electrical power or current consuming device, or consumer, especially associated with an internal combustion engine, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method for monitoring an electric power or current consuming device, said method comprising the steps of:
   a) measuring at least one of a first time point at which a current value for current passing through the consuming device exceeds a first current threshold value and a second time point at which said current value drops below a second current threshold value; and
   b) comparing at least one of said first time point and said second time point measured in step a) with at least one of each other and with other variables to establish plausiblity.

2. The method as defined in claim 1, wherein said at least one of said first time point and said second time point are compared with a characteristic control signal for indicating at least one of a start and an end of controlling the consuming device, in order to establish plausibility.

3. The method as defined in claim 1, further comprising establishing the presence of an implausible condition if a time interval between said first time point and said second time point is at least one of less than a first time threshold and greater than a second time threshold.

4. The method as defined in claim 1, further comprising establishing the presence of an implausible condition if a time interval between said first time point and a control signal, said control signal characterizing a start of control of the consuming device, is greater than or less than a time interval threshold.

5. The method as defined in claim 1, further comprising establishing the presence of an implausible condition if a time interval between said second time point and a control signal, said control signal characterizing an end of control of the consuming device, is greater than or less than a time interval threshold.

6. An apparatus for monitoring an electrical power or current consuming device, said apparatus comprising
   means for measuring at least one of a first time point at which a current value for current passing through the consuming device exceeds a first current threshold value and a second time point at which said current value drops below a second current threshold value; and
   means for comparing at least one of said first time point and said second time point with at least one of each other and with other variables, in order to establish plausiblity.

7. The apparatus as defined in claim 6, wherein said means for measuring said at least one of said first time point and said second time point comprises a current measuring means (150), current threshold generating means (142) and comparing device (141) and said means for comparing including a logic unit (143).

8. The apparatus as defined in claim 7, further comprising means (144) for generating a control signal for controlling the consuming device and wherein said means for generating said control signal is connected with said logic unit to establish a starting time and an ending time of said controlling.

* * * * *